United States Patent
Gates et al.

(10) Patent No.: US 6,989,575 B2
(45) Date of Patent: Jan. 24, 2006

(54) FORMATION OF ARRAYS OF MICROELECTRONIC ELEMENTS

(75) Inventors: Stephen M. Gates, Ossining, NY (US); Roy E. Scheuerlein, Cupertino, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/080,568

(22) Filed: Feb. 25, 2002

(65) Prior Publication Data

US 2002/0081753 A1    Jun. 27, 2002

Related U.S. Application Data

(62) Division of application No. 09/427,251, filed on Oct. 26, 1999, now Pat. No. 6,391,658.

(51) Int. Cl.
  H01L 29/82 (2006.01)
  H01L 43/00 (2006.01)

(52) U.S. Cl. ................................ 257/421; 257/422
(58) Field of Classification Search ................ 257/250, 257/303, 421, 422, 295; 438/157
  See application file for complete search history.

(56) References Cited

U.S. PATENT DOCUMENTS

| | | | |
|---|---|---|---|
| 5,446,299 A * | 8/1995 | Acovic et al. ............. | 257/316 |
| 5,582,640 A | 12/1996 | Okada et al. | |
| 5,640,343 A | 6/1997 | Gallagher et al. | |
| 5,703,805 A | 12/1997 | Tehrani et al. | |
| 5,734,605 A | 3/1998 | Zhu et al. | |
| 5,734,606 A | 3/1998 | Tehrani et al. | |
| 5,748,524 A | 5/1998 | Chen et al. | |
| 5,757,695 A | 5/1998 | Shi et al. | |
| 5,768,181 A | 6/1998 | Zhu et al. | |
| 5,768,183 A | 6/1998 | Zhu et al. | |
| 5,801,397 A * | 9/1998 | Cunningham ............... | 257/66 |
| 5,843,837 A * | 12/1998 | Baek et al. ................. | 438/627 |
| 5,895,947 A * | 4/1999 | Lee et al. .................... | 257/303 |
| 5,902,690 A | 5/1999 | Tracy et al. | |
| 5,940,319 A * | 8/1999 | Durlam et al. ............. | 365/171 |
| 5,991,193 A | 11/1999 | Gallagher et al. | |
| 5,994,749 A * | 11/1999 | Oda ........................... | 257/411 |
| 6,054,734 A * | 4/2000 | Aozasa et al. ............. | 257/315 |
| 6,097,625 A * | 8/2000 | Scheuerlein ............... | 365/171 |
| 6,165,803 A * | 12/2000 | Chen et al. ................. | 438/3 |
| 6,180,444 B1 | 1/2001 | Gates et al. | |
| 6,190,998 B1 | 2/2001 | Bruel et al. | |

(Continued)

OTHER PUBLICATIONS

M. Bruel The History, Physics, and Applications of the Smart-Cut ® Process MRS Bulletin, Dec. 1998, pp. 35-39.

(Continued)

Primary Examiner—Phat X. Cao
(74) Attorney, Agent, or Firm—Richard M. Ludwin, Esq.; McGinn IP Law Group, PLLC (57) ABSTRACT

Arrays of microelectronic elements such as magnetorestive memory elements and FET's, including dual-gate FET's, are fabricated by methods involving a host wafer and a first wafer on which part of the microelectronic elements are separately formed. Conductive elements such as metal-filled vias are formed in the host wafer and extend to its surface. Hydrogen ions are implanted at a selected depth in the first wafer. After formation of selected portions of the microelectronic elements above the hyrogen ion implantation depth of the first wafer, the latter is bonded to the surface of the host wafer so that complementary parts of the two wafers can join to form the microelectronic elements. The first wafer is fractured at the hydrogen ion implantation depth and its lower portion is removed to allow for polishing and affixing of electrodes thereon.

24 Claims, 5 Drawing Sheets

U.S. PATENT DOCUMENTS

| | | |
|---|---|---|
| 6,194,746 B1 * | 2/2001 | Gonzalez et al. ........... 257/104 |
| 6,242,770 B1 | 6/2001 | Bronner et al. |
| 6,423,621 B2 * | 7/2002 | Doan et al. ................. 438/597 |

OTHER PUBLICATIONS

B. Aspar et al., (Elsevier Science B.V.) MicroElectronic Engineering 36 (1997) 233-240 "Basic mechanisms involed in the Smart -Cut ® process".

W. J. Gallagher et al., J. Appl. Phys. 81 (8) Apr. 15, 1997, "Microstructured magnetic tunnel junctions (invited)" pp. 3741-3746.

R. DeJule, "Bringing SDI Wafer Technology to the Mainstream", Semiconductor International Nov. 1998 P40.

J. Markoff "A Milestone on the Road to Ultrafast Computers" New York Times Apr. 6, 1999.

* cited by examiner

FORMATION OF ARRAYS OF MICROELECTRONIC ELEMENTS

The present Application is a Divisional Application of U.S. patent application Ser. No. 09/427,251, filed on Oct. 26, 1999 now U.S. Pat No. 6,391,658.

STATEMENT OF GOVERNMENT RIGHTS

The Government of the United States of America has rights in this invention pursuant to Contract No. MDA972-96-C-0030 awarded by the Defence Advanced Research Projects Agency.

FIELD OF THE INVENTION

The present invention relates to methods for forming arrays of microelectronic elements, such as magnetoresistive memory elements and FET's (field effect transistors).

An embodiment of the present invention relates to a nonvolatile memory storage array for computers and portable electronics, fabricated on a Si wafer substrate with integrated Si electronics, and using a magnetoresistive structures in each memory cell. Specifically in relation to magnetoresistive memory elements, an embodiment of this invention concerns a new structure for a memory cell consisting of a magnetic tunnel junction and a diode, similar to the cell described in U.S. Pat. No. 5,640,343 by Gallagher, et al. This invention also includes a fabrication method for said new structure.

According to an embodiment of the present invention, the new structure described herein comprises a single crystal Si diode located atop a conducting "via" (a metallic or other conducting channel through a lower conductivity layer of Si or the like) of small crossectional area, and further comprises a magnetic tunnel junction (MTJ) located atop said diode. The novel fabrication method uses a wafer bonding process to place such a single crystal Si (SCS) diode atop the conducting via.

DESCRIPTION OF THE PRIOR ART

Previously, magnetic memory cells consisting of a magnetic tunnel junction and a diode (herein called "MagRAM") have been described in U.S. Pat. No. 5,640,343 by Gallagher, et al (IBM) and also in U.S. Pat. No. 5,734,605 by Zhu, et al (Motorola). Arrays of said memory cells were described in both of these patents. Generally, each MagRAM memory cell contains two magnetic regions separated by a thin dielectric layer through which electron tunnelling occurs and the dielectric is known as the tunnel barrier. A first magnetic layer has a fixed magnetization axis and serves as a magnetic reference layer and is composed of relatively permanent ("hard") magnetic materials. The tunnel barrier is sandwiched between the first and second magnetic layers. The second magnetic layer is relatively easily switched between 2 magnetic states, which are aligned parallel and anti-parallel to the magnetic axis of the first reference layer. The first and second magnetic layers and the tunnel barrier comprise a trilayer MTJ, and the electrical resistance of said MTJ has two well defined values corresponding to the two alignment states of the second ("free") magnetic layer. Information storage is performed by assigning 0 and 1 to the two electrical resistance states of each cell.

Arrays of MTJ memory cells containing upwards of 1,000 cells are very useful. An extremely high information storage density suitable for very large scale integrated (VLSI) circuits is possible using a very compact (small area) MTJ cell design that is vertically integrated, and wherein each cell consists of an MTJ and a diode in a vertical stack located at the intersection of two metal thin film wires, and the MTJ plus diode stack electrically contacts each of said thin film wires. This vertically integrated memory cell occupies a minimum area of the VLSI chip yielding the maximum information density, and is known as the "crosspoint architecture".

In such a crosspoint architecture memory cell, a diode is located atop the bottom metal conductor (row line). An MTJ is located atop the diode, electrically in series with the diode. The top metal conductor is above and in contact with the MTJ. When the resistance of the cell is sensed, the sense current flows through only one memory cell, instead of through N cells as in conventional series architecture magnetoresistive memories. The signal-to-noise ratio (SNR) of the crosspoint array containing N elements is N times larger than the conventional array containing N elements. Alternatively, the SNR can be the same and the sense power of the crosspoint architecture can be reduced by a factor of N×N (or N squared).

The sensing operation is a measurement of resistance, and any series resistance that is similar in magnitude to the MTJ resistance detracts from the signal. Thus, the diode should have a small series resistance, and this diode resistance should be uniform throughout an array of many diodes (memory cells). The diode atop the row line may be formed in a small lithographically defined piece of semiconductor such as Si, and furthermore this Si piece ("island") may consist of 1 large crystal grain (single crystal or monocrystalline), or may consist of multiple smaller crystal grains (polycrystalline). The polycrystalline state is typical of thin film semiconductors.

The advantages of using a single crystal Si (SCS) diode (as opposed to a thin film diode) in the MagRAM cell, and in high density arrays of these cells, are improved electrical performance, and more uniform electrical characteristics in large arrays of diodes (e.g. 1,000×1,000 arrays). Specifically, the electrical performance of an SCS diode includes a lower series resistance (higher forward current density) and a higher rectification (ratio of Forward/Reverse bias currents). With a lower diode resistance, a given value of the sense current during the Read operation requires a lower voltage, and hence the power consumption is lower. Also, a higher diode conductivity interferes less with the Read operation, when the conductivity of the MTJ device used to store the data is sensed. With a higher diode rectification, less current is passed in the reverse bias direction, and so overall power consumption of the array is reduced.

SUMMARY OF THE INVENTION

The present invention broadly provides a method of forming an array of microelectronic elements, said method comprising the steps of:

a) preparing a first wafer of semiconductor material by implanting, through a first surface of said first wafer, ions to a planar region at a selected depth therein, said ions being ions of an element selected from hydrogen and the noble gases, b) preparing a second wafer of semiconductor material, said second wafer comprising a layer of dielectric material having a second surface, a pattern of mutually electrically isolated metal conductors being disposed within said layer, said metal conductors comprising spaced apart conducting regions extending to and being exposed at said second surface, c) placing said first wafer over said second wafer with said first surface of said first wafer in juxtaposed adherence and electrical contact with said second surface and with said conducting regions exposed thereat, and d) inducing a fracture along said planar region of said first wafer to leave a semiconductor layer of said first wafer bounded between said first surface and a fracture surface formed in said planar region, said first surface remaining in electrically contacting adherence with said second surface.

Preferably, step a) comprises a further step of forming a semiconductor device in the aforesaid semiconductor layer above each of said conducting regions of said metal conductors.

According to a preferred embodiment, the aforesaid microelectronic elements are magnetoresistive memory elements and the method comprising the further step of forming an MTJ structure in electrical contact with said semiconductor layer above each of said conducting regions of said metal conductors. The semiconductor device can be a diode which is in electrical contact with the magnetoresistive memory element.

According to another preferred embodiment, step a) comprises a further step of forming a field effect transistor at positions in said semiconductor layer which overlie said conducting regions of said metal conductors, each of said conducting regions (e.g. metal-filled via) serving as a first gate electrode of said field effect transistor. Moreover, step a) may then comprise a further step of forming a first oxide layer on said first surface of said first wafer before step c). Advantageously, a second oxide layer may be formed on the fracture surface, and further, a second gate electrode may formed to overlie each such field effect transistor (FET).

The invention further provides an array of microelectronic elements comprising:

a) a substrate of semiconductor material, b) a lower layer of dielectric material disposed with a lower surface in contact with said substrate and an upper surface in spaced adjacency thereto, c) a pattern of mutually electrically isolated metal conductors disposed within said lower layer of dielectric material, said metal conductors comprising a plurality of spaced apart conducting regions extending to said upper surface of said lower layer, d) an upper layer of delectric material disposed with a lower surface thereof in contact with and bonded to said upper surface of said lower layer, and e) a plurality of nodes of oriented single crystal grain monocrystalline semiconductor material disposed within said upper layer of dielectric material, each of said nodes being in electrical contact with only one of said conducting regions at said upper surface of said lower layer. Preferably, the oriented single crystal grain semiconductor material is oriented in the <100> orientation As will be understood, each of the nodes may comprise a semiconductor device, such as a diode. Alternatively, the microelectronic elements may comprise magnetoresistive memory elements each comprising a said diode and an MTJ structure.

Desireably, each semiconductor device may be a field effect transistor comprising a first gate electrode in contact with one of said conducting regions at said upper surface of said lower layer Moreover, a first insulating layer may be disposed over an upper surface of said upper layer and a second insulating layer may be formed over said upper surface of said lower layer, and a second gate electrode may be deposited upon the aforesaid first insulating layer above each field effect transistor.

It is a purpose of the present invention to combine the stated advantages of an SCS diode with the highest density (smallest area) crosspoint MagRAM cell. It is preferable to locate the SCS diode in the MagRAM cell atop a via of small area, rather than located directly atop the word line.

One advantage of the structure of the present invention using a filled via is reliability. The structure of the present invention is more reliable because this structure prevents a solid state reaction between the Si diode and the metal comprising the word line, by using a conductive diffusion barrier material to fill the via. Suitable diffusion barrier materials include W, TiN, TaN, and the TaSiN ternary alloys. Without such a barrier, only refractory metal word lines which are relatively unreactive with Si may be used. A second advantage of the structure of the present invention using a filled via is enabling a lower resistance metal (copper) to comprise the word line. The Refractory metal word lines have a relatively high resistance, and therefor only small arrays of memory elements can be made. Using the diffusion barrier structure of this invention, higher conductivity metals including Cu and Al may be used to form the word line, and larger memory arrays can be made. Both Cu and Al react with Si at low temperatures if a barrier is not placed between the metal and Si. In the present structure, the metal via height is minimized to allow close proximity of the lower conductor (word line) and the MTJ.

It is an object of the present invention to disclose a stepwise method to make the structure of the present invention. This method consists of the following general steps: A first semiconductor wafer (for example Si) is prepared containing a p/n junction diode consisting of thin n-type and p-type Si layers, and specifically the first wafer has a smooth first surface. Furthermore, the first wafer also contains a zone below the first surface and below the p/n junction diode containing implanted atoms of hydrogen or a noble gas, which zone becomes a fracture zone upon heating the wafer. A second semiconductor wafer, optionally containing resistance sensing circuits, is prepared containing spaced apart metal conductors (word lines) with spaced apart filled via holes atop said metal conductors. Said second wafer contains a second surface, the surface area of which consists of a smooth dielectic layer containing spaced apart filled vias. The first surface of the first wafer and the second surface of the second wafer are placed in intimate contact in a clean environment, and held in intimate contact during heating of the wafer pair. Upon heating, the first wafer fractures into a layer of Si which is very thin (<0.5 micron thick) and is compliant to the second wafer and becomes bonded onto the second surface of the second wafer, whereupon the bulk of the first wafer is removed. The thin compliant Si layer containing the p/n junction becomes functionally the top of the second wafer. Individual memory elements are then fabricated on the second wafer located atop each of the filled vias, said memory elements consisting of a diode in series with an MTJ. Each diode is formed in the thin bonded Si layer. Each MTJ is located atop a diode, and each diode is atop a filled via. The memory array is completed by surrounding all the memory elements with a bulk dielectric (polymer, or deposited oxide or nitiride of Si), and then forming a second set of spaced apart metal conductors (bit lines) atop the dielectric and electrically contacting the MTJ's. The second set of metal conductors is approximately perpendicular to the word line conductors, forming the previously mentioned "crosspoint" architecture which yield a very high information storage density.

Fabrication of the inventive structures is now described in reference to the Figures. The fabrication method of the present invention makes use of a process known as the Smart-CutR (a trademark of the Soitec company) process, details of which have been described in many publications, for example in BASIC MECHANISMS INVOLVED IN THE SmartCutR PROCESS, by B. Aspar and co-workers, appearing in Microelectronic Engineering 36 (1997) p. 233.

Briefly, the Smart-CutR process uses implantation of hydrogen or noble gas ions into a first Si wafer and wafer bonding techniques to transfer a thin Si layer and bond said thin Si layer onto a second Si wafer substrate. Optionally, the second wafer may contain other layers or patterned structures. Specifically, the first wafer is implanted with H+ ions at 95 keV energy and dose from 0.3 to $1 \times 10^{17}$ cm−2. Inside a clean environment (clean room), the first and second wafers are placed in intimate contact, both of said wafers having atomically smooth surfaces on the contacting surfaces. When the assembly of first and second wafers in intimate contact is heated to 400–600° C., the 1st wafer fractures at the H implanted zone, and a thin Si layer is bonded to the second wafer. Due to the roughness of the new surfaces formed by fracture, the two wafers are easily separated and the bulk of the first wafer can be re-used. The transferred thin Si layer becomes structurally a part of the second wafer, and the new, fractured, surface of the transferred thin Si layer is polished.

Figure 1:
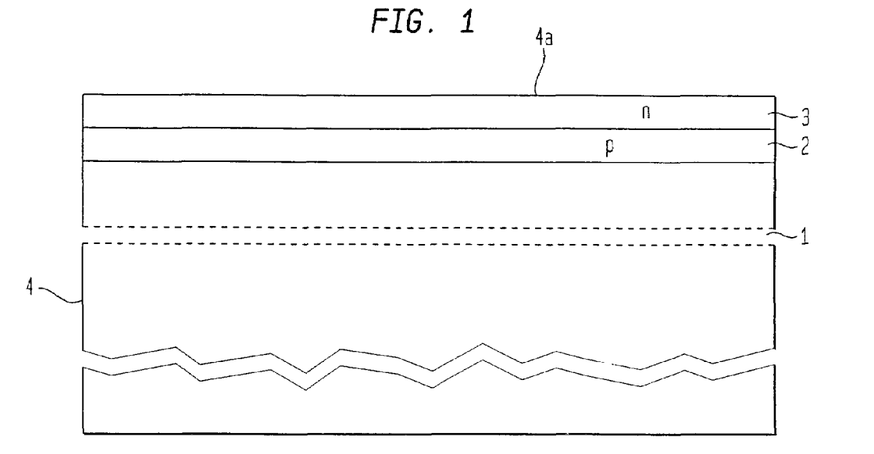
FIG. 1 is a schematic cross-sectional view of the implanted first Si wafer.

Details of the method of the present invention are now described. FIG. 1 shows the Implanted Si wafer 4 after the implantation steps, which are conducted as follows 1. A sacrificial silver oxide layer 2 is be formed on Si wafer 4.
2. Medium energy boron ions (B+)) are implanted to form a p-type zone 2 containing boron.
3. Low energy ions of As+ or Sb+ are implanted to form the n-type zone 3 (with upper surface 4a) containing the n-type dopant.

After implantation steps 1. and 2, the 1st wafer is annealled at about 1,000° C. for a few seconds to activate the dopants. This completes the high temperature processing steps.

3. High energy H+ implantation to form the H+-implanted zone 1.

To make the thinnest possible diode structure, low implantation energy is used and the thermal activation cycle is minimized, and a sacrificial silicon oxide layer may be left on the surface 4a during H+ implantation. Alternatively, solid source diffusion from a deposited layer containing Boron may be used to convert the p-type layer.

The bulk of the first Si wafer 4 is not affected by these implantation steps.

Next, the H+ or other ions are implanted through surface 4a to a planar region 1 at a selected depth within wafer 4. After implantation, any remaining sacrificial oxide layer is removed.

Figure 2:
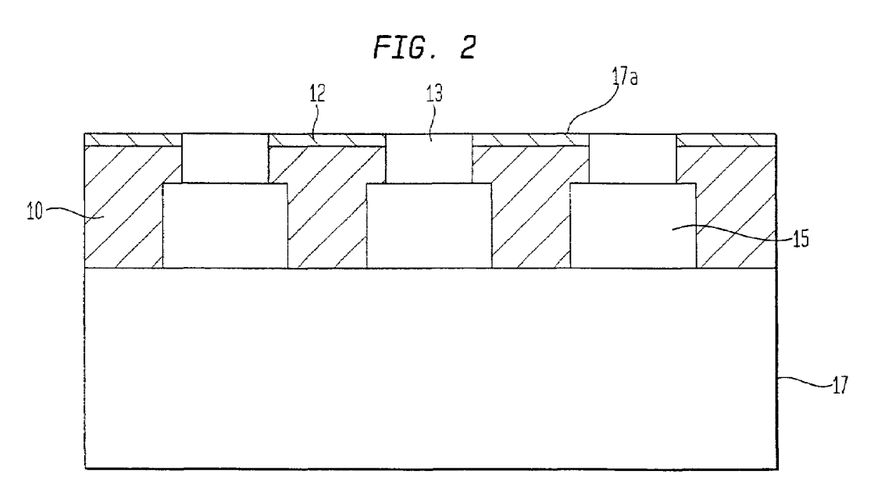
FIG. 2 is a schematic cross-sectional view of the host second Si wafer.

FIG. 2 shows the second (host) Si wafer 17 in cross section after completion of many processing steps. Optionally, circuits (not shown) to address a memory array are already fabricated on the second (host) wafer, and a metal conductor 15 has been patterned. The conductor wires 15 are surrounded by a dielectric layer 10. Via holes have been etched in the dielectric layer and filled with a barrier material to form vias 13. The barrier material is selected from the group consisting of tungsten, tantalum, tantalum nitride (TaN), titanium nitride (TiN) and TaSiN ternary compounds. The filled vias, 13, are actually openings in the dielectric layer 10 which have been filled with the barrier material (see above), and this material electrically contacts the metal thin film wires, 15. The via material is exposed in small regions and the top surface 17a of the second (host) wafer 17 has a small fraction of the surface area consisting of the via barrier material 13. The CMP (chemical mechanical polish) conditions are adjusted to uniformly etch both the via material 13 and the dielectric 10, forming the smooth second surface 17a on the second wafer 17.

A specific feature of this invention is to place a bonding promoter layer, 12, at the second surface of the 2nd wafer 17. For example, a thin layer of a glass having a softening temperature of 400–500° C. is the bonding promoter. Below the promoter layer 12 is a dielectric 10, such as deposited SiO2.

Alignment marks are present on the host wafer 17 for use in subsequent lithography steps described below in reference to FIGS. 5 and 6.

Figure 3:
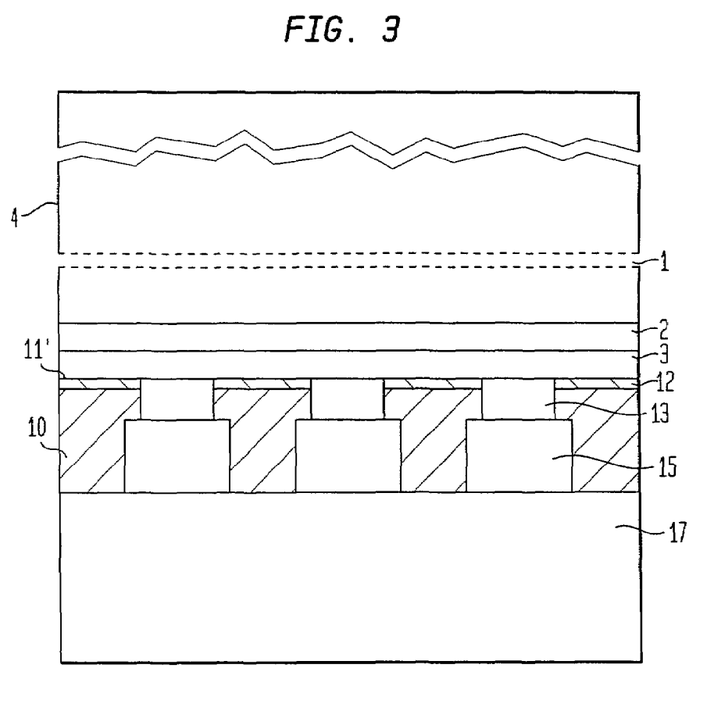
FIG. 3 is a schematic cross-sectional view with the first wafer of FIG. 1 disposed over the second wafer with the first surface of the first wafer in juxtaposed adherence and electrical contact with the second or top surface of the second (host) wafer.

FIG. 3 shows the first wafer 4 located with its first surface 4a placed in juxtaposed adherence to the second surface 17a of the second wafer 17 after the bonding step. The two wafers 4, 17 are joined at the bonded interface, 11', where the first and second surfaces 4a, 17a are in intimate contact so that the metal vias 13, make ohmic electrical contact to the n-type layer 3. The remaining parts of the first wafer 4 (p-type layer, 2, H+-implant zone 1, and bulk of 1st wafer, 4) are now located atop the Host second wafer 17.

The structure shown in FIG. 3 is then annealed to 400 to 600° C. The anneal temperature is selected according to the softening temperature of the bonding promoter layer 12. At the H+-implant zone 1, the first wafer 4 fractures by means of hydrogen induced void formation, enabling the bulk of the first wafer 4, to be removed and leaving a thin Si layer compliant to the second surface and bonded to the second Host wafer 17. (This process is sometimes called the "SmartCut", a trademark of the SOITEC company.)

Figure 4:
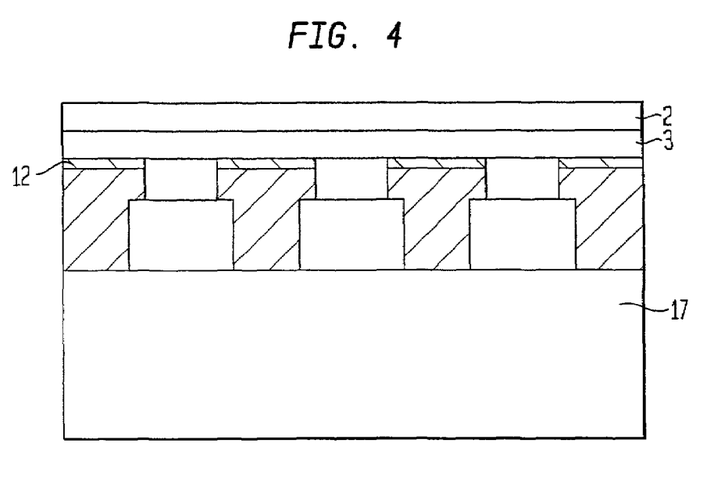
FIG. 4 is a schematic cross-sectional view of the elements of FIG. 3 after the fracture step and removal of part of the first wafer, leaving a layer in adherence with the second surface of the second wafer.

The Si layer has 2 components, the n-type layer, 3, and a p-type Si layer, 2. FIG. 4 shows the resulting structure after the anneal/fracture/transfer step. The Si layers 2 and 3 have been transferred onto the second (host) wafer 17, and then the top surface of the structure is thinned and made smooth by CMP. This CMP step is necessary because the fractured Si surface is fairly rough.

Figure 5A:
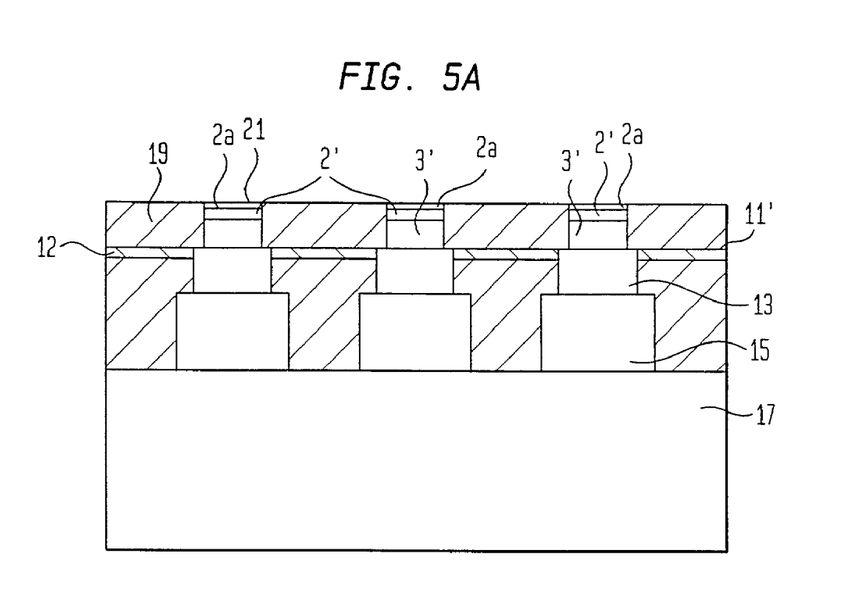
FIG. 5A is a schematic cross-sectional view showing the structure of FIG. 4 after the first step of a two lithographic step process to form diodes and MTJ structures over conducting regions (metal vias) formed within the second wafer and exposed at its second surface.
Figure 5B:
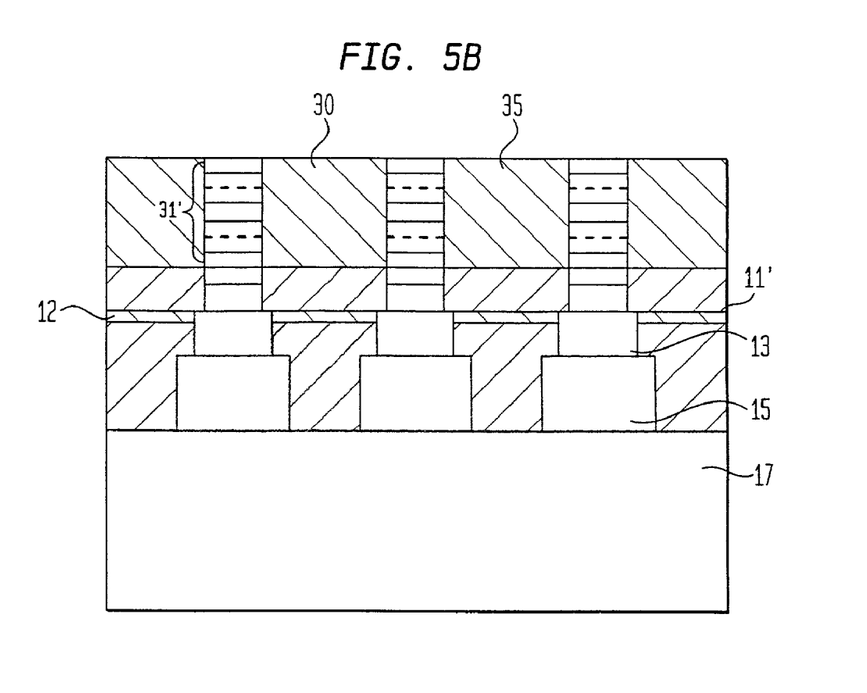
FIG. 5B is a schematic cross-sectional view showing the structure of FIG. 5A after second step of a two lithographic step process to form the diode mesas and the MTJ mesas.
Figure 6A:
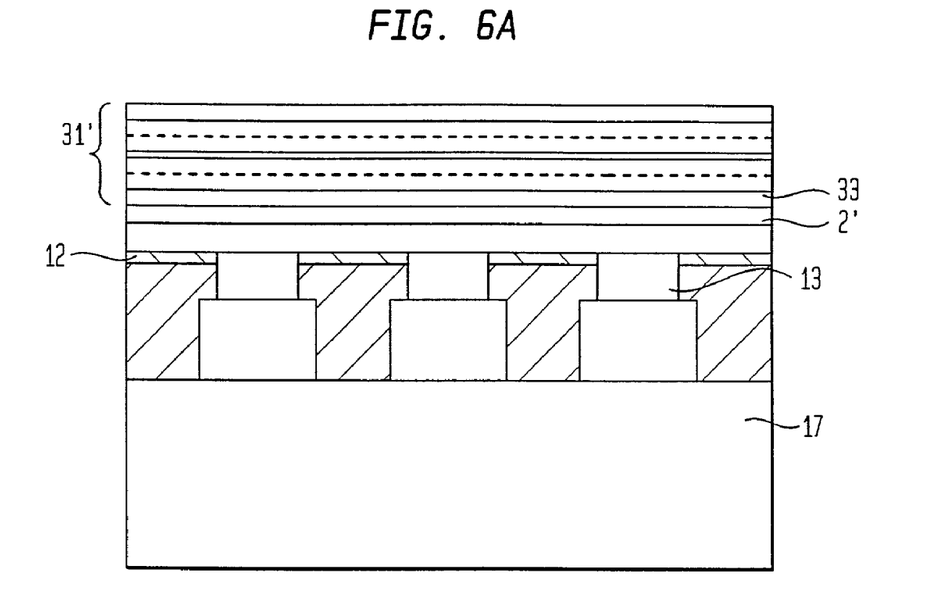
FIG. 6A is a schematic cross-sectional view showing the structure of FIG. 4 midway through a one-lithographic step process to form diode mesas and the MTJ mesas.
Figure 6B:
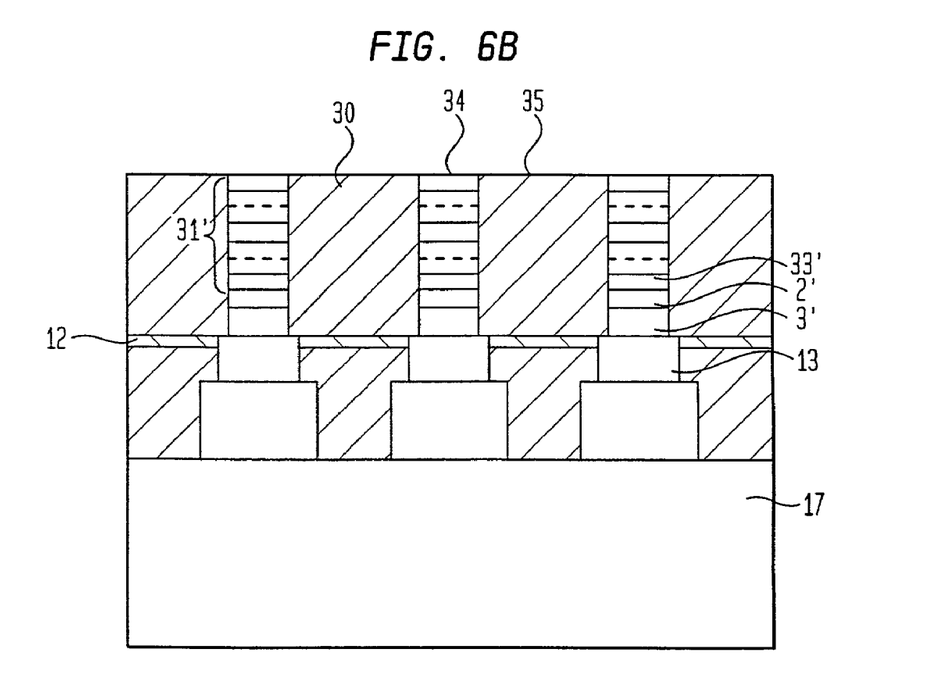
FIG. 6B is a schematic cross-sectional view showing the final structure at the end of the one-lithographic step process to form the diode mesas and the MTJ mesas.

The structure of FIG. 4 can be completed using either two lithographic steps (FIGS. 5A, 5B), or using a single lithographic step (FIGS. 6A, 6B). Before lithography, the Si layer is removed over alignment marks located in the periphereal region of the second wafer 17, in order to align the remaining lithography steps with the structures on the host wafer 17.

FIG. 5A shows the structure after Step 1 of the two lithography step process to form the diode mesas and the corresponding MTJ mesas. An etch stop layer 2a for CMP such as TiN is deposited on layer 2' in preparation for step 1 of the 2 lithography step procedure. In step 1, the diode mesas are patterned and etched, leaving the Si layers 2a, 2' and 3' now in the form of mesas (islands). Said Si mesas are in ohmic contact with the metal vias 13. The space surrounding said Si mesas is filled with a deposited dielectric (oxide or nitride of Si ), 19. The top surface of this structure is planarized by CMP leaving a smooth surface, 21. Next a barrier/contact layer (Ti/TiN or TaSiN for example) is deposited and annealed. This is a barrier against metal migration into the SCS diode, and also results in a low contact resistance between the SCS diode and the metal MTJ structure. The barrier/contact layer should have adhesion to the dielectric 19 and appropriate surface characteristics for forming MTJ's as described in the literature on MTJ's , as in Gallagher et al, below.

The MTJ structure is next fabricated. One example of the process to fabricate the MTJ is described in detail in MICROSTRUCTURED MAGNETIC TUNNEL JUNCTIONS, by W. J. Gallagher et al, in JOURNAL OF APPLIED PHYSICS 81, 1997, p. 3741.

Summarizing an example of the general MTJ fabrication method, the MTJ consists of a "fixed" magnet layer, a thin dielectric tunnel barrier, and a "free" (or switchable) magnetic layer. Herein, this MTJ structure is called the trilayer MTJ structure, and the abbravation Py means "permalloy" which is Fe19Ni81. The magnetic layers are deposited by sputter deposition in an applied magnetic field, and this field axis defines the magnetic axis of the films. To deposit the MTJ trilayer structure, the following 3 steps may be employed.

First, a permanent magnet layer about 20 nm thick is deposited to form the "fixed" magnet, and this layer may be composed of sub-layers. For example, the permanent magnet layer may be composed of a seed layer of 5 nm thick Py is to act as a template layer, under a 10 nm antiferromagnetic layer 10 nm under a ferromagnetic "fixed" layer of 10 nm thick Py of iron manganese alloy (FeMn).

Second, a thin dielectric layer of 1–3 nm thickness is deposited to serve as a tunnel barrier. This layer must be free of holes or other defects, and must be uniform in thickness in order to fabricate MTJ's with uniform resistance, and must be as thin as possible. For example, a layer of Al2O3 about 1.5 nm thick is an optimum dielectric layer.

Third, a "soft" magnetic layer, which may be readily switched between 2 magnetic states is deposited. For example 10 nm of Py forms an optimum switchable magnet. Optionally, there may be conductive electrode layers of about 10–50 nm thickness above the tri layer MTJ structure.

FIG. 5B shows the structure after Step two of the two-step lithography process to form the diode mesas and the MTJ mesas. The MTJ stack is deposited and then patterned into MTJ mesas (islands), 31', which are present only above the metal vias and diode mesas. The space surrounding said MTJ mesas is filled with a deposited dielectric (oxide or nitride of Si), 30. The top surface of this structure is planarized by CMP leaving a smooth surface, 35.

FIGS. 6A and 6B show the one-step lithography process to form the diode mesas and the MTJ mesas. Referring to FIG. 6A, two layers comprising the Si diode layers are 2' (which was formed by implant after wafer bonding) and 3 (which was formed by implant into the implanted wafer 4 before bonding). In FIG. 6A these Si diode layers 2', 3 are intact across the entire wafer 17. Next a barrier/contact layer (Ti/TiN for example) is deposited over layer 2' and annealed, as described above for low resistance contacts and as a reaction/diffusion barrier. Next, the MTJ stack, 31, is deposited over the entire wafer, including the seed layer, 33, and a contact layer 3, such as Ti or TiN or TaSiN.

In this process, the entire MTJ stack and the Si layers are to be patterned using a single lithographic mask step, but using different RIE etch chemistries and the thin magnetic layers may be etched using ion beam etching.

Referring to FIG. 6B, the MTJ mesas (islands), 31', may be etched using metal RIE chemistry (Cl based). Then, the diode mesas are etched, using the Si RIE chemistry (F based), leaving the Si layers 2' and 3' now in the form of mesas (islands). These Si (diode) mesas are in ohmic contact with the metal vias 13. The space surrounding these MTJ mesas 31 and these Si diode mesas is filled with deposited dielectric 30 (an oxide or nitride of Si). The top surface of this structure is planarized by CMP down to contact layer 34 leaving a smooth surface, 35. The top conductor (not shown), or bit line, is formed on the top surface 35.

Figure 7:
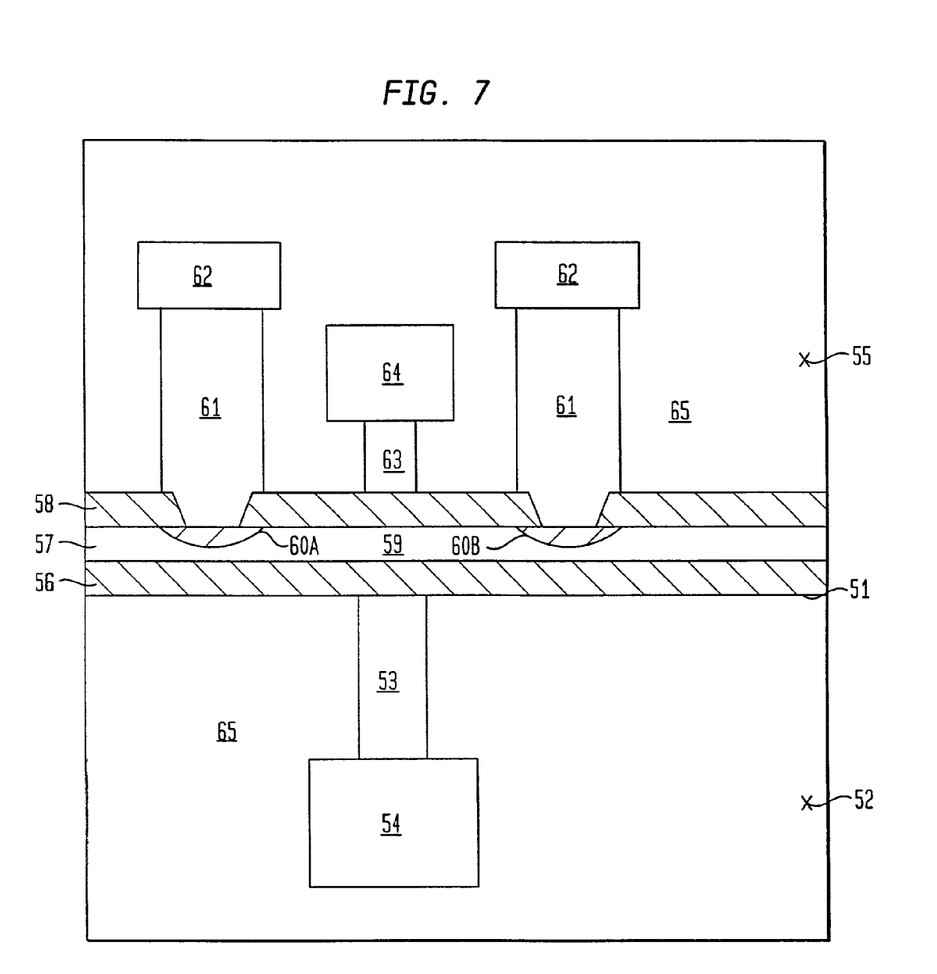
FIG. 7 is a schematic cross-sectional view showing a dual gate FET structure formed in accordance with the present invention.

FIG. 7 illustrates a dual gate transistor structure which may be fabricated at each via or other conducting region, such as via 53 which will have been formed within a second (host) wafer 52 before it is bonded at its surface 51 to a first wafer 55. As can be seen, a thin film wire conductor 54 is also formed on wafer 52 and connected to via 53 which extends to surface 51. Preferably, via 53 and conductor 54 are composed of doped poly-Si, W, Ta, or another refractory metal. For the dual gate transistor structure of FIG. 8, via 53 forms the bottom gate of the transistor.

As shown in FIG. 7, the first wafer 55, which has been bonded to the second wafer 52 at surface 51, contains a thin dielectric (e.g. SiO2) layer 56, a thin Si layer 57, and a second thin dielectric layer 58. These three layers 56, 57, and 58 have been "cut" (e.g. by the smartCut method) from the first wafer 55 after bonding the latter to second wafer 52. As depicted, source and drain regions 60A, 60B have been formed within Si layer 57 by ion implantation or other doping process (through openings etched in dielectric layer 58) to leave a channel region 59 therebetween. Conductor-filled vias 61, with a metal or doped poly-Si, extend from thin film metal wires 62 down into contact with source and drain regions 60A, 60B. A conductor filled via 63, which extends from thin film metal wire 64 toward channel region 59, serves as the top gate of the dual gate transistor structure. In this structure, dielectric layers 56, 58 serve to isolate channel 59 from gates 53, 63. The dielectric field oxide 65 surrounds the above-mentioned conductive elements of FIG. 7 and provides structural support.

The present invention has been described with reference to preferred embodiments in order to facilitate a better understanding of the invention. However, those skilled in the art will recognize that the invention can be embodied in various ways without departing from the scope and spirit of the invention as set forth in the appended claims.

What is claimed is:

1. An array of microelectronic elements comprising:
   a substrate of semiconductor material;
   a lower layer of dielectric material disposed with a lower surface in contact with said substrate and an upper surface in spaced adjacency thereto;
   a pattern of mutually electrically isolated conducting regions disposed within said lower layer of dielectric material, said conducting regions extending to said upper surface of said lower layer;
   an upper layer of dielectric material disposed with a lower surface thereof in contact with and bonded to said upper surface of said lower layer;
   a plurality of nodes of semiconductor material disposed within said upper layer of dielectric material, each of said nodes being in electrical contact with only one of said conducting regions at said upper surface of said lower layer; and
   a bonding promoting layer formed on said lower layer of dielectric material, said bonding promoting layer bonding said lower surface of said upper layer of dielectric material to said upper surface of said lower layer,
   wherein each conducting region comprises:
      a metal conductor; and
      a via which is filled with a diffusion barrier material, said diffusion barrier material extending between said metal conductor and a node in said plurality of nodes and electrically connecting said metal conductor with said node.

2. An array as set forth in claim 1, wherein each of said nodes comprises a semiconductor device.

3. An array as set forth in claim 1, wherein said semiconductor material comprises oriented single crystal grain, monocrystalline semiconductor material, and each of said nodes comprises a diode.

4. An array as set forth in claim 3, wherein said microelectronic elements comprise magnetoresistive memory elements each comprising a said diode and an MTJ structure.

5. An array as set forth in claim 2, wherein said semiconductor device comprises a field effect transistor.

6. An array as set forth in claim 5, wherein a first insulating layer is disposed over an upper surface of said upper layer and a second insulating layer is formed over said upper surface of said lower layer.

7. An array as set forth in claim 3, wherein said oriented single crystal grain semiconductor material is oriented in the <100> orientation.

8. An array as set forth in claim 1, wherein said electrically conducting material comprises at least one of W, Ti, and Ta.

9. The array as set forth in claim 1, wherein said bonding promoting layer comprises a glass layer having a softening temperature in a range of 400° C. to 500° C.

10. The array as set forth in claim 1, wherein said via comprises an area which is less than an area of said metal conductor.

11. The array as set forth in claim 1, wherein said diffusion barrier material comprises one of TiN, TaN and a TaSiN ternary alloy.

12. The array as set forth in claim 1, wherein said node which is electrically connected to said metal conductor is aligned with said via and said metal conductor.

13. The army as set forth in claim 1, wherein said node comprises a semiconductor diode.

14. The array as set forth in claim 1, wherein said metal conductor and said semiconductor material in said node are separated by said diffusion barrier material.

15. A microelectronic element array comprising:
   a semiconductor substrate;
   a first dielectric layer formed on said substrate;
   a plurality of electrically isolated conductive regions disposed within said first dielectric layer, each conductive region comprising:
      a metal conductor; and
      a conductive via which is filled with a diffusion barrier material formed on said metal conductor;
   a second dielectric layer having a lower surface which is bonded to an upper surface of said first dielectric layer;
   a plurality of semiconductor nodes formed in said second dielectric layer, each semiconductor node contacting said conductive via and being electrically connected to said metal conductor by said conductive via; and
   a bonding promoting layer formed on said first dielectric layer, said bonding promoting layer bonding said lower surface of said second dielectric layer to said upper surface of said first dielectric layer,
   wherein said diffusion barrier material extends between said metal conductor and a node in said plurality of nodes.

16. The array according to claim 15, wherein said plurality of semiconductor nodes comprises a plurality of monocrystalline semiconductor diodes.

17. The array according to claim 15, wherein each conductive region extends from said substrate to said upper surface of said first dielectric layer.

18. The array according to claim 15, wherein each conductive region further comprises a word line, said via being formed on said word line.

19. The array according to claim 16, further comprising:
   a plurality of magnetic tunnel junction (MTJ) elements, each MTJ element in electrical contact with a diode in said plurality of monocrystalline semiconductor diodes.

20. The array according to claim 19, wherein each said MTJ element and each said diode combine to form a memory element.

21. The array according to claim 15, wherein said via includes therein at least one of W, Ti, and Ta.

22. The array according to claim 15, wherein each said conductive region further comprises a metal layer in electrical contact with said via, said metal layer being formed of a different material than said via.

23. The array according to claim 18, wherein said via includes therein a refractory metal and said word line comprises one of copper and aluminum.

24. A microelectronic element array comprising:
   a first dielectric layer formed on a substrate;
   at least one electrically isolated conductive region formed in said first dielectric layer, said at least one conductive region comprising:
      a metal conductor; and
      a conductive via which is filled with a diffusion barrier material formed on said metal conductor;

a second dielectric layer which is bonded to said first dielectric layer; and at least one semiconductor node formed in said second dielectric layer, said at least one semiconductor node being formed on and contacting said at least one conductive region; and a bonding promoting layer formed on said first dielectric layer, said bonding promoting layer bonding a lower surface of said second dielectric layer to an upper surface of said first dielectric layer, wherein said diffusion barrier material extends between said metal conductor and said at least one semiconductor node and electrically connects said metal conductor to said at least one semiconductor node.

* * * * *